United States Patent
Yang et al.

(10) Patent No.: US 7,977,246 B2
(45) Date of Patent: Jul. 12, 2011

(54) THERMAL ANNEALING METHOD FOR PREVENTING DEFECTS IN DOPED SILICON OXIDE SURFACES DURING EXPOSURE TO ATMOSPHERE

(75) Inventors: Haichun Yang, Santa Clara, CA (US); Chien-Teh Kao, Sunnyvale, CA (US); Xinliang Lu, Fremont, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 518 days.

(21) Appl. No.: 12/173,279

(22) Filed: Jul. 15, 2008

(65) Prior Publication Data
US 2009/0269930 A1    Oct. 29, 2009

Related U.S. Application Data

(60) Provisional application No. 61/125,494, filed on Apr. 25, 2008.

(51) Int. Cl.
  *H01L 21/302* (2006.01)
(52) U.S. Cl. ......... 438/715; 438/717; 438/722; 438/743
(58) Field of Classification Search .............. 438/715, 438/717, 722, 743
See application file for complete search history.

(56) References Cited

U.S. PATENT DOCUMENTS

| 6,268,298 B1* | 7/2001 | Komura et al. | 438/787 |
| 6,734,108 B1* | 5/2004 | Jin et al. | 438/700 |
| 2002/0081852 A1* | 6/2002 | Sandhu | 438/692 |
| 2003/0003756 A1* | 1/2003 | Yu | 438/706 |
| 2008/0242048 A1* | 10/2008 | Nakai et al. | 438/440 |

OTHER PUBLICATIONS

U.S. Appl. No. 12/173,331, filed Jul. 15, 2008, Kao et al.

* cited by examiner

*Primary Examiner* — Binh Tran
(74) *Attorney, Agent, or Firm* — Robert M. Wallace

(57) ABSTRACT

A thermal anneal process for preventing formation of certain BPSG surface defects following an etch or silicon clean step using a fluorine and hydrogen chemistry. The thermal anneal process is carried out while protecting the wafer from moisture, by heating the wafer to a sufficiently high temperature for a sufficient duration of time to thermally diffuse boron and/or phosphorus materials separated from silicon near the surface of the doped glass layer into the bulk of the layer. The thermal anneal process is completed by cooling the wafer to a sufficiently low temperature to fix the distribution of the boron and/or phosphorus materials in bulk of the doped glass layer.

19 Claims, 5 Drawing Sheets

THERMAL ANNEALING METHOD FOR PREVENTING DEFECTS IN DOPED SILICON OXIDE SURFACES DURING EXPOSURE TO ATMOSPHERE

CROSS-REFERENCE TO RELATED APPLICATIONS

This application claims the benefit of U.S. Provisional Application Ser. No. 61/125,494, filed Apr. 25, 2008 entitled METHOD FOR PREVENTING DEFECTS IN DOPED SILICON OXIDE SURFACES DURING EXPOSURE TO ATMOSPHERE, by Haichun Yang, et al.

BACKGROUND

Fabrication of ultra large scale integrated circuits on a silicon semiconductor wafer involves the covering of thin film devices with a dielectric layer prior to deposition of metal. This dielectric layer may be referred to as the pre-metal dielectric layer. One of the important features of this layer is good planarity of the surface that it creates. Otherwise, it can cause depth of focus issue for a subsequent photolithography process and high contact resistance. One approach to achieve the planarity is to use a dielectric material that is flowable at elevated temperature. Thus a planar surface can be achieved by reflow at an elevated temperature after dielectric material deposition. Boron-phosphate-silicate-glass (BPSG) is typically used as the dielectric material. The BPSG material is a compound of silicon oxide with boron and phosphorus. Following deposition of the BPSG pre-metal dielectric layer, high aspect ratio openings are formed in the layer to expose portions of the underlying silicon wafer to which electrical contact is to be established. However, a native oxide layer may formed on top of Si surface after the contact holes are formed. In order to ensure good electrical contact, this native oxide needs to be removed. A wet clean step, normally referred as HF dip, is normally used as the conventional method for this native oxide removal process. However, as the feature size shrinks, a wet clean step cannot be used due to: 1. High BPSG/SiO2 selectivity, which results in a large change in critical dimension (CD); 2. The wet chemical may not penetrate to the bottom of the smaller features; and, 3. Environmental concerns for the wet chemical clean. Thus a dry clean (plasma etch) method is preferred for the native oxide removal step. The electrical contact is then formed by first performing a pre-metallization step in which a metal silicide is formed on the exposed silicon surface at the bottom of each opening. Each opening is then filled with metal.

The plasma etch process is performed in an etch reactor chamber and may employ a remote plasma source using a process gas containing hydrogen and fluorine compounds. Following the plasma etch clean process, the wafer is transferred from the etch chamber to a metallization reactor chamber. During this transfer, the wafer may be exposed for significant periods to an atmospheric environment. It has been observed that during this exposure, convex-shaped defects, which may possibly consist of $BPO_4$ or $BPO_4 \cdot 3H_2O$, begin to form on the surface of the BPSG dielectric layer, and grow in size from a few nanometer to several tens of microns, in some cases. These convex-shaped surface defects adversely affect the electrical behavior of contacts formed in the openings and can interfere with photolithographic steps. Attempts have been made to alter the parameters of the various process steps described above in an attempt to prevent formation of these defects, but such attempts have been unsuccessful.

SUMMARY

A method is provided for fabricating an integrated circuit on a semiconductor wafer while preventing the formation of certain surface defects. A thin film device structure is covered with a doped glass layer and openings are formed through the doped glass layer to expose a surface of each of the semiconductor elements of the thin film device structure. A dry clean step is then performed by generating a plasma from a process gas of fluorine species and hydrogen species and exposing the wafer to by-products of the plasma, to clean the exposed semiconductor surfaces. A thermal anneal process is then carried out while preventing exposure of the wafer to water vapor or moisture-containing atmosphere. The thermal anneal process is carried out by heating the wafer to a sufficiently high temperature for a sufficient duration of time to thermally diffuse boron and/or phosphorus materials separated from silicon near the surface of the doped glass layer into the bulk of the layer. The thermal anneal process is completed by cooling the wafer to a sufficiently low temperature to fix the distribution of the boron and/or phosphorus materials in bulk of the doped glass layer.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 1A through 1E depict a semiconductor device in a sequence of process steps in accordance with a first embodiment, of which FIGS. 1D and 1E are enlarged views of a portion of the device.

Figure 1A:
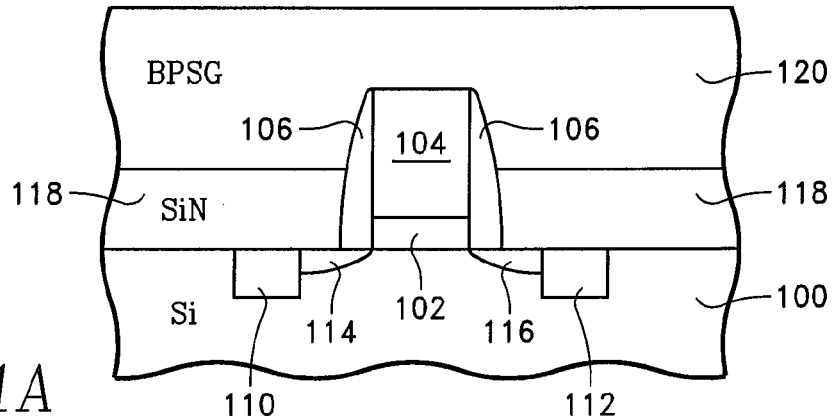

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Surface defects in BPSG films that are found following a plasma etch process step are prevented by driving isolated boron and phosphorus materials from the BPSG layer surface by either a high temperature anneal step followed by rapid quenching or by a plasma process that converts the isolated boron and phosphorus materials to gas phase compounds.

Figure 1B:
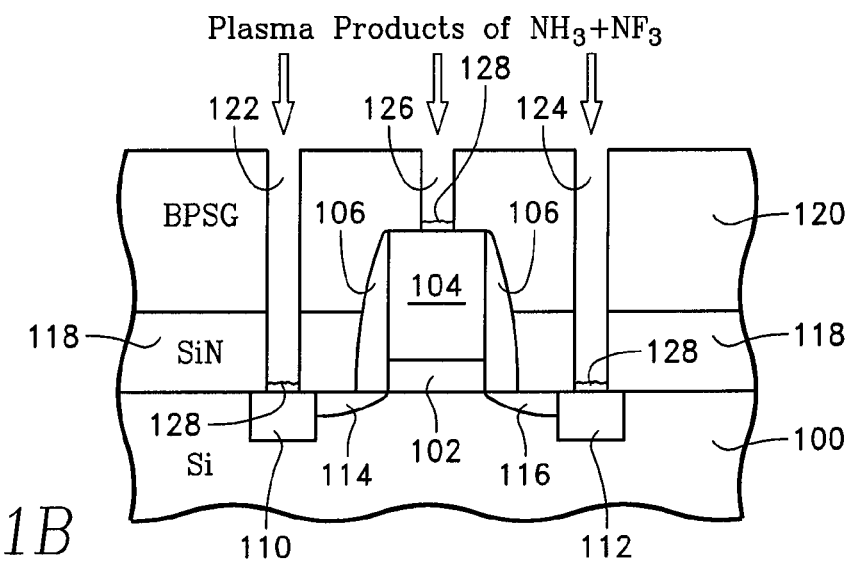
Figure 1C:
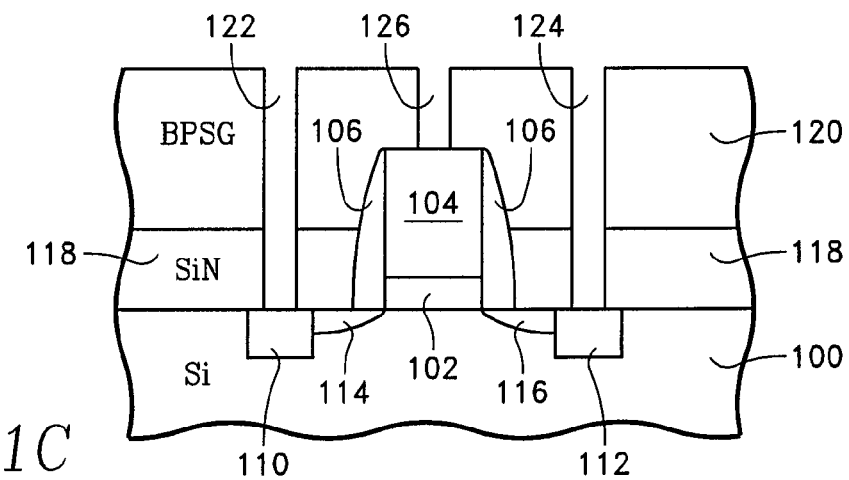

Referring to FIG. 1A, a semiconductor device included in an integrated circuit is formed on a semiconductor substrate 100 such as a crystalline silicon wafer. If the device is a transistor, then it may include a thin silicon dioxide gate insulation layer 102 and a polycrystalline silicon gate electrode 104 overlying the gate insulation layer 102. A silicon nitride dielectric spacer 106 may be formed at the sides of the gate electrode 104. The device may further include a source 110 and drain 112 formed in the surface of the substrate 100 and shallow source and drain extensions 114, 116 formed by ion implantation of dopant species. A silicon nitride insulation layer 118 overlies the surface of the wafer 100. The device is covered by a pre-metallization dielectric layer 120, typically a boron phosphorus silicon glass (BPSG) material. High aspect ratio openings 122, 124, 126 shown in FIG. 1B are etched through the BPSG layer 120 to reach the source 110, drain 112 and the gate electrode 104, respectively. In order to ensure good electrical contact to the silicon surface at the bottom of each opening 122, 124, 126, a native oxide layer 128 must be removed from the silicon surface at the bottom of each opening 122, 124, 126. This is accomplished by a plasma enhanced etch (dry clean) process employing a remote plasma source using an etchant process gas having a hydrogen and fluorine process chemistry, as indicated in FIG. 1B. The hydrogen and fluorine-based process gas must be employed in order to etch the native silicon oxide layer 128 at a high etch rate while etching the exposed BPSG surfaces at a very low etch rate. This behavior prevents excessive etching the side walls of the openings 122, 124, 126 in the BPSG layer 120 during removal of the native oxide film 128 from the exposed silicon surfaces. One example of such a process gas is a mixture of $NH_3$ and $NF_3$ gases. The result is the removal of the native oxide film 128 from the exposed silicon surfaces, as depicted in FIG. 1C. A similar process may be employed, if desired, to control (e.g., slightly widen) the profile of the openings 122, 124, 126.

We have discovered that the problem of convex surface defects growing on the surfaces of the BPSG layer 120 is related to the presence of the dopant species of boron and phosphorus and is caused by the plasma-enhanced etch processes for silicon cleaning. The hydrogen and fluorine chemistry employed in the etch process (e.g., $NH_3+NF_3$) works well for this purpose because it efficiently removes native silicon dioxide at the exposed silicon surface at the bottom of etch hole without damaging the BPSG layer 120 or enlarging the etch critical dimension (CD) too much. However, the combined hydrogen and fluorine chemistry also reacts with the silicon and oxygen components of the BPSG material at the surface of the BPSG layer 120, removing them as a silicon oxide, but generally does not attack the boron and phosphorus materials in the BPSG layer 120. As a result, the etch process separates silicon-oxide materials from much (or all) of the boron and phosphorus materials on the BPSG layer surface, leaving the boron and phosphorus materials by themselves at the surface, probably in the form of boron and phosphorus oxides (e.g., $B_2O_5$ and $P_2O_5$). These materials are referred to herein as isolated boron and phosphorus (dopant) materials, because the silicon-oxide materials with which they were previously combined have been removed. These isolated boron and phosphorus materials may react with water vapor in the atmosphere, to form compounds that grow as convex-shaped surface defects on the BPSG layer surface.

This growth may continue as long as the wafer is exposed to a vapor-containing atmosphere. The problem is that the wafer must be removed from the etch chamber following the step of FIG. 1C for transport to a metallization chamber. In this transport, there may be a queue time of as long as 24 hours or more, during which the wafer is exposed to vapor-containing atmosphere, and the BPSG surface defects can grow to reach tens of microns in size during that time. BPSG surface defects 130 are depicted in FIG. 2, which is an enlarged view of a portion of the device of FIG. 1C after about 24 hours exposure to a water vapor-containing atmosphere.

Figures 1D, 1E:
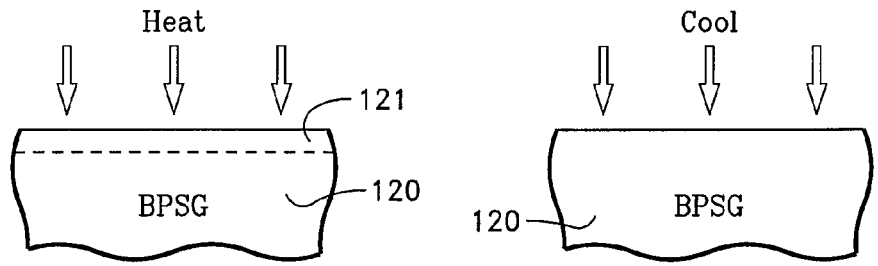
Figure 2:
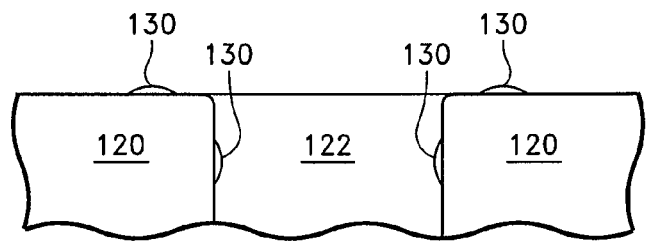
FIG. 2 is an enlarged view of a portion of FIG. 1C after prolonged exposure to vapor-containing atmosphere.

We have discovered one method in accordance with a first embodiment for preventing the formation of the BPSG surface defects 130 of FIG. 2. In this method, the wafer is kept in a non-moisture containing atmosphere immediately after the plasma-enhanced etch step employing the hydrogen and fluorine chemistry. This etch step may be the cleaning process step of FIG. 1B. Following this step, and before the wafer is exposed to atmosphere or vapor, the wafer is annealed or heated to a sufficiently high temperature for a sufficient duration to drive all (or at least nearly all) of the isolated boron and phosphorus materials deeper into the BPSG layer 120 and away from the surface by thermal diffusion. This thermal diffusion temperature may be in a range of about 350° C. to 550° C. or more specifically in a range of about 400° C. to 500° C. (e.g., about 475° C.) and the duration may be in a range of about 10 seconds to 120 seconds or more specifically in a range of about 20 seconds to 60 seconds. This step is depicted in the enlarged view of FIG. 1D showing the existence of a surface zone 121 containing the isolated boron and phosphorus materials at each exposed surface of the BPSG layer 120. The result is that dopant distribution in the BPSG layer 120 becomes more homogeneous throughout the BPSG layer 120, so that the surface zone 121 essentially disappears, as indicated in FIG. 1E. The wafer continues to be kept away from any water vapor-containing atmosphere, while the next step is performed, in which the wafer is quenched (cooled quickly) to permanently fix the homogeneous boron and phosphorus distribution achieved in the previous step. This quenching step, depicted in FIG. 1E, consists of cooling the wafer from its heated temperature (e.g., 475° C.) down to 70° C. or below 70° C. within a short time, e.g., within less than about 2 minutes. The duration of the quenching step (less than 2 minutes) is sufficiently short and the final quenching temperature (e.g., 70° C.) is sufficiently low to fix the homogeneous distribution of the dopants in the BPSG layer. Thereafter, the wafer may be removed for transport to the metallization reactor chamber and exposed to water vapor-containing atmosphere for a much longer duration while waiting to be admitted to the metallization chamber, without formation of the BPSG surface defects depicted in FIG. 2.

During the plasma etch step, the $NH_3+NF_3$ process gas is supplied to the chamber of a remote plasma source, and plasma by-products from the remote plasma source flow through the ceiling gas distribution showerhead of the reactor chamber containing the wafer. Thereafter, the thermal diffusion anneal step and the quenching step are performed in different chambers dedicated to carrying out those steps. During the plasma etch or clean step, the wafer temperature is held at or below a nominal value (e.g., 70° C.). During the thermal diffusion anneal step, the wafer may be heated to the desired anneal temperature (e.g., 475° C. as discussed above). During the subsequent quenching or cooling step, the wafer is rapidly cooled to 70° C. or below. Following the plasma clean step and following the thermal anneal step, the wafer is transferred to the next chamber using vacuum transfer to avoid exposure to atmosphere. Optionally, these three steps may be carried out in a single chamber capable of performing all three steps.

Figure 3:
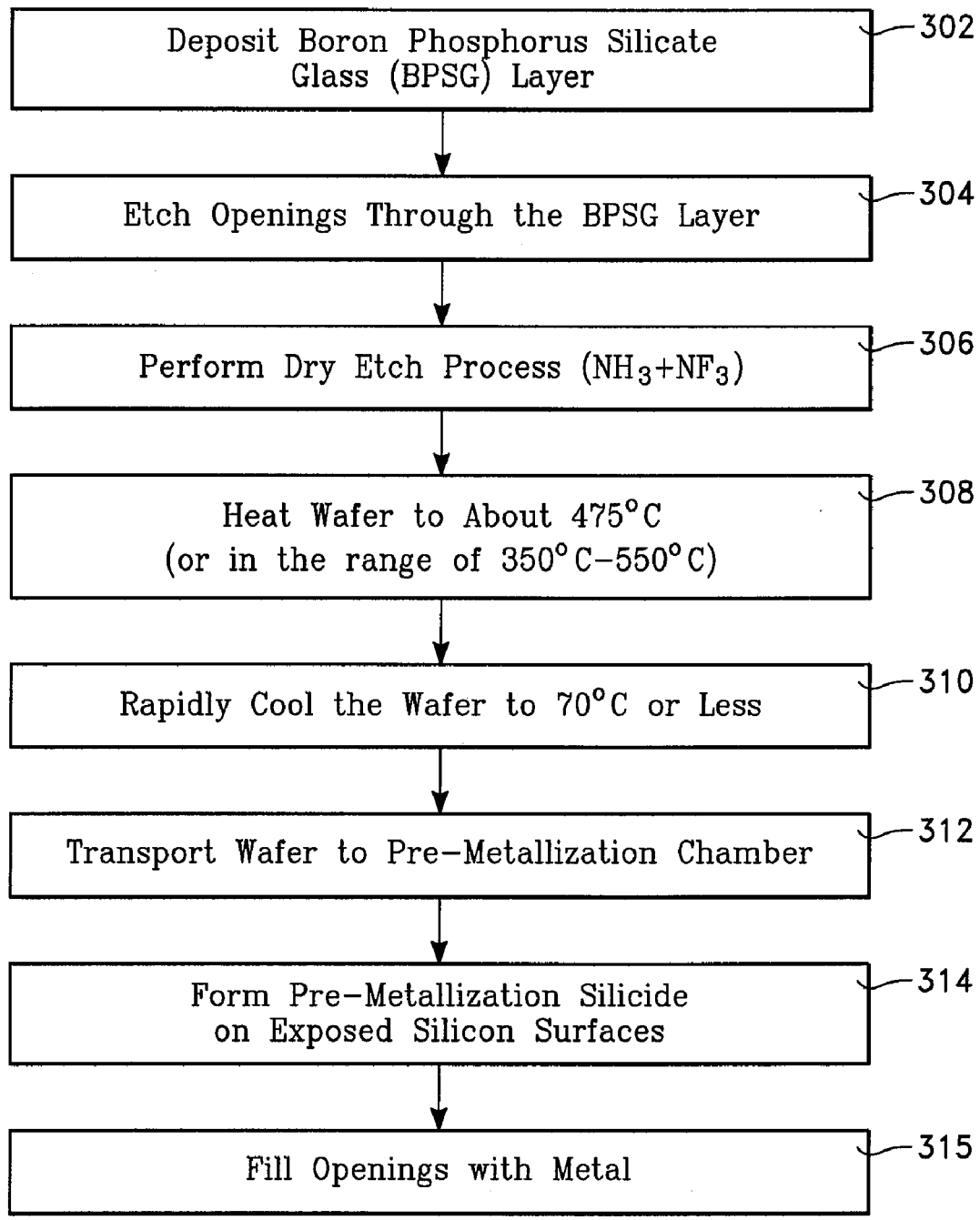
FIG. 3 is a block diagram of a process in accordance with the first embodiment.

A process sequence in accordance with this method is depicted in block diagram form in FIG. 3. After integrated circuit devices have been formed on a semiconductor wafer, the BPSG layer 120 is deposited (block 302 of FIG. 3) and the openings 122, 124, 126 are etched (block 304). The plasma (dry) etch process for silicon cleaning or profile control is performed using a process gas containing fluorine and hydrogen species (block 306). While continuing to maintain the wafer in a vacuum or dry atmosphere, such as a nitrogen or inert gas atmosphere, the wafer is heated to the thermal anneal temperature and held at that temperature for the required duration discussed above (block 308). The temperature and duration may vary, but they are sufficient to drive the isolated boron and phosphorus materials away from the exposed surfaces of the BPSG layer 120. This creates a more homogeneous distribution of boron and phosphorus materials within the BPSG layer 120. While continuing to protect the wafer from moisture or vapor, the wafer is cooled down to the quenching temperature (for example, below 70° C.) within the quenching duration, for example, 2 minutes or less (block 310), or at least to a temperature sufficiently low to fix in place the homogenous boron and phosphorus distribution below the BPSG layer surface achieved in the previous step. The wafer is then transported to a metallization chamber (block 312). In the course of transport, the wafer may be exposed to moisture-containing atmosphere without the development of the convex-shaped BPSG surface defects. In the metallization chamber, a metal silicide (e.g., nickel silicide or cobalt silicide) is formed at each exposed surface of the silicon substrate at the bottom of each high aspect ratio opening in the BPSG layer (block 314), after which each opening is filled with metal (block 315).

In a second embodiment, the isolated boron and phosphorus materials are removed from the exposed surfaces of the BPSG layer 120 by a plasma treatment step that is performed after the plasma etch (dry clean) step of FIG. 1B. The plasma treatment step is performed in place of the thermal annealing and quenching steps of FIGS. 1D and 1E. In the plasma treatment step of the second embodiment, the wafer is exposed to special treatment by-products of a plasma. These plasma treatment by-products react only with the isolated boron and phosphorus materials at the BPSG layer surfaces, but do not attack the BPSG material (the chemical combination of boron, phosphorus, silicon and oxygen) or do so with a negligible etch rate. As a result, the BPSG layer 120 is not damaged. The reaction converts only (or primarily) the isolated boron and phosphorus materials to gas phase compounds. These gas phase compounds depart from the BPSG layer surface to become gases in the chamber, completing removal of the isolated boron and phosphorus materials. This removal of the isolated boron and phosphorus prevents formation of the convex-shaped BPSG surface defects.

Figures 4A, 4B:
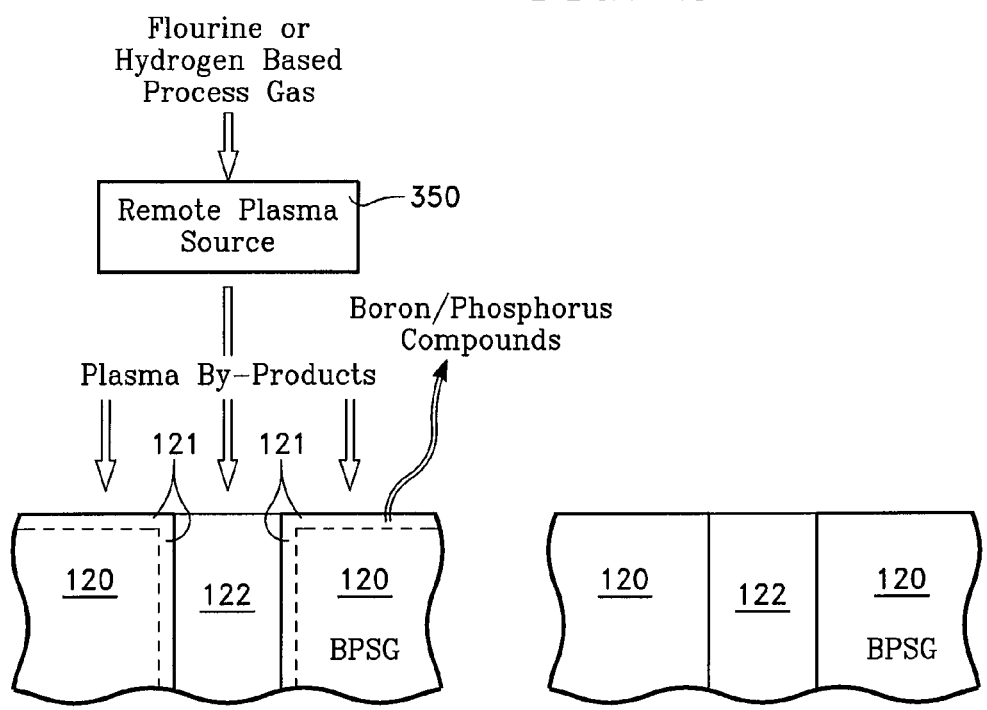
FIGS. 4A and 4B depict a portion of a semiconductor device in a sequence of process steps in accordance with a second embodiment.

This embodiment is depicted in FIG. 4A, in which the BPSG layer 120 immediately following the plasma etch step of FIG. 1B has a surface zone 121 containing the isolated boron and phosphorus materials described above, at both the top surface and the side wall of the opening 122 (for example). A process gas containing either fluorine species or hydrogen species (but not both) is introduced into a remote plasma source 350, and the substrate or wafer is exposed to plasma by-products from the remote source 350. The isolated boron and phosphorus materials in the surface zone 121 react with the plasma by-products to form volatile compounds that leave the surface zone 121 to become gases in the chamber. This eliminates the surface zone 121 of isolated boron and phosphorus materials, as depicted in FIG. 4B. Following this removal, it has been found that the wafer may be exposed to wafer vapor-containing atmosphere for an extended period (e.g., two days) without forming the convex surface defects in the BPSG surface.

Figure 5:
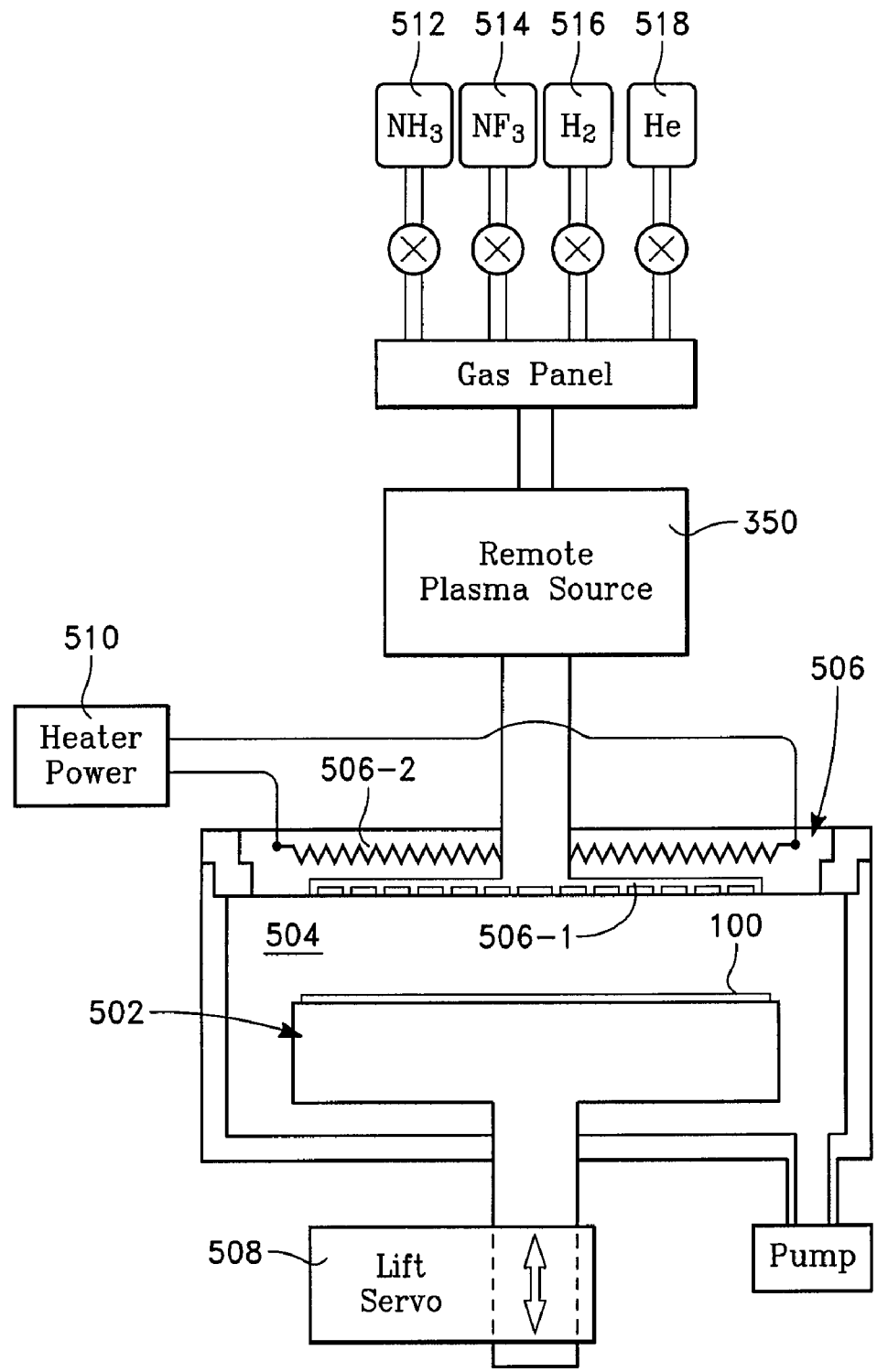
FIG. 5 depicts apparatus for carrying out the sequence of process step of the second embodiment.

FIG. 5 depicts a reactor useful in carrying out the method of the second embodiment. The reactor of FIG. 5 is employed to first carry out the plasma etch process of FIG. 1B and then carry out the plasma treatment process of FIGS. 4A and 4B while leaving the wafer in place. The substrate or wafer 100 is supported on a wafer support 502 in a chamber 504 having a ceiling 506 that includes a gas distribution plate or showerhead 506-1 and an electric heater 506-2. A lift servo 508 controls the spacing between the wafer 100 and the heated ceiling 506 to control wafer temperature. A power source 510 furnishes electric power to the heater in the ceiling 506. The gas distribution showerhead 506-1 receives a gas from the remote plasma source 350 consisting of plasma by-products generated in the remote source 350. Gas supplies 512, 514, 516, 518 can furnish the following gases to the remote source 350 at independently controlled gas flow rates: $NH_3$, $NF_3$, $H_2$, He, respectively.

During the silicon-clean plasma etch step (previously described with reference to FIG. 1B), the gas supplies 512 and 514 furnish $NH_3$ and $NF_3$ to the remote source 350, while the other supplies 516, 518 are inactive.

The next step is to perform the plasma treatment for converting the isolated boron and phosphorus materials to gas phase compounds. There are two modes for performing this step, one in which a hydrogen-based chemistry is employed and another in which a fluorine-based chemistry is employed. In the hydrogen-based mode, the gas supply 512 furnishes $NH_3$ at a rate in a range of 50-300 sccm (e.g., 100 sccm) to the remote source 350, the gas supply 516 furnishes $H_2$ at a rate in a range of 100-2000 sccm (e.g., 1000 sccm) to the remote source 350, and the gas supplies 514, 518 are inactive. In the fluorine-based mode, the gas supply 514 furnishes $NF_3$ at a rate in a range of 25-150 sccm (e.g., 50 sccm) to the remote source, the gas supply 518 furnishes He at a rate in a range of 100-1000 sccm (e.g., 300 sccm) to the remote source 350, and the gas supplies 512, 516 are inactive. In the hydrogen-based mode, the wafer temperature is kept at a reduced temperature in a range of about 20° C.-70° C. (e.g., 50° C.). In the fluorine based mode, the wafer temperature is kept at an elevated temperature in a range of about 90° C.-200° C. (e.g., 100° C.).

In another embodiment, the plasma source is not remote but rather in situ, and the wafer is held in the same chamber in which the plasma is generated for the plasma treatment of the isolated boron and phosphorus materials. For the fluorine based mode, the plasma for the plasma treatment may be either in situ or remote, and in either case the BPSG layer is not attacked by the plasma while only the isolated boron and phosphorus materials are converted to gas phase. The use of a remote plasma source in the hydrogen based mode is desired because the plasma by-products from the hydrogen based plasma of the remote source do not attack the BPSG layer 120 while converting the isolated boron and phosphorus materials to gas phase, whereas an in situ hydrogen based plasma may tend to attack the BPSG layer 120.

Figure 6:
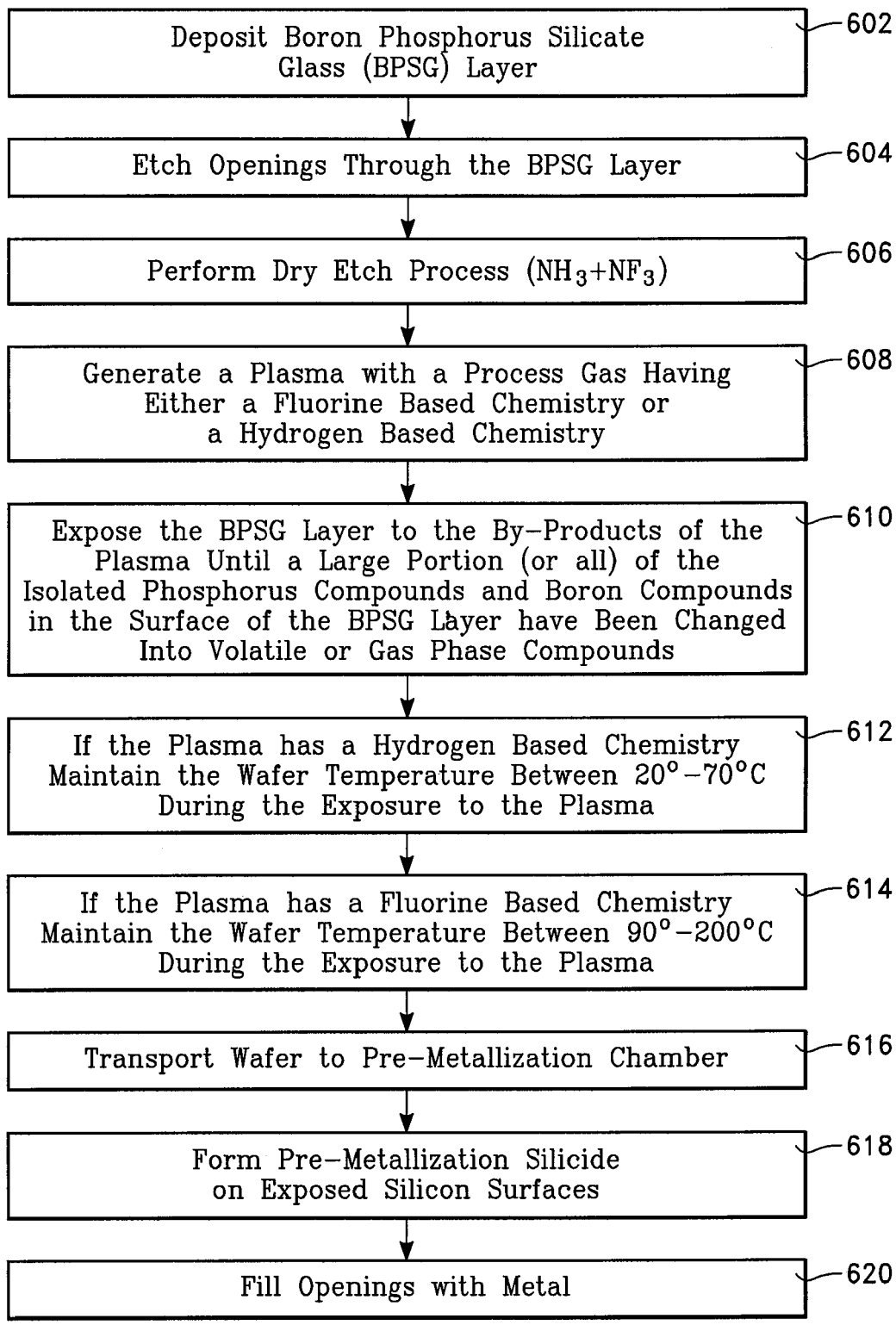
FIG. 6 is a block diagram of a process in accordance with the second embodiment.

The process of the second embodiment is depicted in block diagram form in FIG. 6. The first step is to deposit the BPSG layer (block 602 of FIG. 6). Openings are etched in the BPSG layer (block 604) to expose the underlying silicon material. The plasma (dry) etch process for cleaning the silicon is performed using the $NH_3+NF_3$ process gas mixture (block 606) fed to the remote plasma source 350. Then, the process gases fed to the remote source are changed to either a hydrogen-based chemistry ($NH_3+H_2$) or a fluorine-based chemistry ($NF_3+He$) and the resulting plasma by-products are supplied to the showerhead of the ceiling 506 of FIG. 5 (block 608 of FIG. 6). The wafer is exposed to the plasma by-products in the chamber 504, which removes the isolated boron and phosphorus materials from the exposed surfaces of the BPSG layer 120 by converting those materials to gas phase compounds (block 610). If the process gases are hydrogen-based, then the wafer temperature is kept at below 70° C. or about 20° C.-70° C. (e.g., 50° C.) (block 612) during the plasma treatment step of block 610. If the process gases are fluorine-based, then the wafer temperature is kept at about 90° C.-200° C. (e.g., 100° C.) (block 614) during the plasma treatment step of block 610. The plasma treatment step of block 610 is carried out for a sufficient duration to thoroughly remove the isolated phosphorus and boron materials from the BPSG surfaces, which may be about 60 seconds, for example. Thereafter, the wafer is transported to a metallization chamber (block 616) and a pre-metallization silicide layer is formed on the exposed silicon surfaces (block 618). Thereafter, the openings are filled with metal (block 620).

While the foregoing is directed to embodiments of the present invention, other and further embodiments of the invention may be devised without departing from the basic scope thereof, and the scope thereof is determined by the claims that follow.

What is claimed is:

1. A method of fabricating an integrated circuit on a semiconductor wafer, comprising:
    forming a thin film device structure on the wafer including semiconductor elements;
    covering said thin film device structure with a doped glass layer comprising silicon, oxygen and at least one of boron or phosphorus;
    forming openings through said doped glass layer to expose a surface of each of said semiconductor elements;
    performing an etch step by generating a plasma from a process gas comprising fluorine species and hydrogen species and exposing said wafer to by-products of said plasma;
    preventing exposure of said wafer to water vapor or moisture-containing atmosphere while performing the following:
    (a) heating said wafer to a sufficiently high temperature for a sufficient duration of time to thermally diffuse boron and/or phosphorus materials separated from silicon near the surface of said doped glass layer into the bulk of said doped glass layer; and
    (b) cooling said wafer to a sufficiently low temperature to fix the distribution of the boron and/or phosphorus materials in bulk of said doped glass layer.

2. The method of claim 1 wherein said preventing exposure comprises holding said wafer in a nitrogen atmosphere.

3. The method of claim 1 wherein said preventing exposure comprises holding said wafer in an inert gas atmosphere.

4. The method of claim 1 wherein said wafer is a silicon wafer and wherein the exposed surface of each of said semiconductor elements comprises a silicon surface, and wherein said silicon surface forms a native oxide film after the step of forming openings exposes the silicon surface, and wherein said etch removes said native oxide film without etching said doped silicon glass layer.

5. The method of claim 1 wherein said etch step comprises a dry clean step for removing native oxide from a silicon surface.

6. The method of claim 1 wherein said cooling step is carried out within a sufficiently short time duration to prevent return of the boron and/or phosphorus materials to the surface of said doped glass layer.

7. The method of claim 6 wherein said sufficiently short time duration is less than about 2 minutes.

8. The method of claim 1 wherein said sufficiently high temperature is in a range of about 350° C. to about 550° C. and said sufficiently low temperature is below about 70° C.

9. The method of claim 8 wherein said sufficient duration of time of said heating is in a range of about 10 to 120 seconds.

10. The method of claim 8 wherein said sufficiently high temperature is in a range of about 400° C. to 500° C.

11. The method of claim 10 wherein said sufficient duration of time is in a range of about 20 seconds to 60 seconds.

12. A method of fabricating an integrated circuit on a semiconductor wafer, comprising:
    forming a thin film device structure on the wafer including semiconductor elements;
    covering said thin film device structure with a doped glass layer comprising silicon, oxygen and at least one of boron or phosphorus;
    forming openings through said doped glass layer to expose a surface of each of said semiconductor elements;
    performing an etch step by generating a plasma from a process gas comprising fluorine species and hydrogen species and exposing said wafer to by-products of said plasma;
    preventing exposure of said wafer to water vapor or moisture-containing atmosphere while performing the following:
    (a) heating said wafer to a temperature in a range of about 350° C. to about 550° C.; and
    (b) cooling said wafer to a temperature below about 70°C.

13. The method of claim 12 wherein said cooling step is carried out within less than about 2 minutes.

14. The method of claim 12 wherein said heating step is carried out for a duration in a range of 10 seconds to 120 seconds.

15. The method of claim 12 wherein said preventing exposure comprises holding said wafer in a nitrogen atmosphere.

16. The method of claim 12 wherein said preventing exposure comprises holding said wafer in an inert gas atmosphere.

17. The method of claim 12 where said heating comprises heating said wafer to a temperature in a range of about 400° C. to 500° C. for a duration in a range of about 20 to 60 seconds and said cooling comprises cooling said wafer to about 70° C. or below within about 2 minutes or less.

18. The method of claim 12 wherein said heating step is carried out for a duration in a range of about 20 seconds to 60 seconds.

19. The method of claim 18 wherein heating step heats said wafer to a temperature in a range of about 400° C. to 500° C.

* * * * *